SEMICONDUCTOR DEVICE

Filed Sept. 1, 1966

INVENTOR.
Lowell E. Clark
Lee M. Farrar

BY

Mueller, Aichele & Rauner

ATTY'S.

3,436,617

SEMICONDUCTOR DEVICE

Lee M. Farrar, Scottsdale, and Lowell E. Clark, Phoenix, Ariz., assignors to Motorola, Inc., Franklin Park, Ill., a corporation of Illinois Filed Sept. 1, 1966, Ser. No. 576,598
Int. Cl. H01l 5/00; H03k 19/08
U.S. Cl. 317—235 8 Claims

ABSTRACT OF THE DISCLOSURE

A unijunction transistor having an emitter on one face and a plurality of low resistivity regions suitable for base one contacts on the same face at preselected distances from the emitter. Electrical contact is made to the emitter and to at least one of the low resistivity regions completing a device having preselected electrical characteristics. The base two contact may be made to an opposed major face of the device.

This invention relates to semiconductor devices and more particularly to a unijunction transistor with a novel unijunction transistor die that improves the capability of obtaining preselected electrical characteristics in the finally fabricated device.

Unijunction transistors were developed as double base diodes in the early 1950's. These early devices had the well known bar structure with a base one and base two on opposite ends of the bar and an emitter positioned intermediate the bases. This structure is still used today in a large number of commercial unijunction transistors. As the popularity of the devices increased, the well known cube structure was developed as a complement to the bar structure. In both of these unijunction transistor structures, at least one of the critical regions is formed by alloying a wire to a body of semiconductor material. The criticality of the diameter and spacing, with respect to the base, of this alloyed region requires close control to fabricate devices meeting required specifications.

As semiconductor technology advanced, a diffused structure for the unijunction transistor evolved having the base one, base two and emitter regions on the same face of the die. In diffused devices the characteristics are generally dependent upon the degree of accuracy of the single diffusion forming the base regions.

With such devices, a slight variation in the critical diameters causes the finally assembled devices to have electrical characteristics that do not fall within the preselected range of values.

An object of the invention is to provide a unijunction transistor structure that is more easily fabricated and that results in higher yields of assembled devices meeting preselected electrical characteristics.

Another object of the invention is to provide a unijunction transistor having higher interbase modulated current and better temperature compensation than prior art devices.

A feature of the invention is a novel unijunction transistor die having an emitter region and, spaced therefrom, a plurality of base one regions on one face of the die and a base two region substantially over the entire opposite face thereof.

Figure 2:
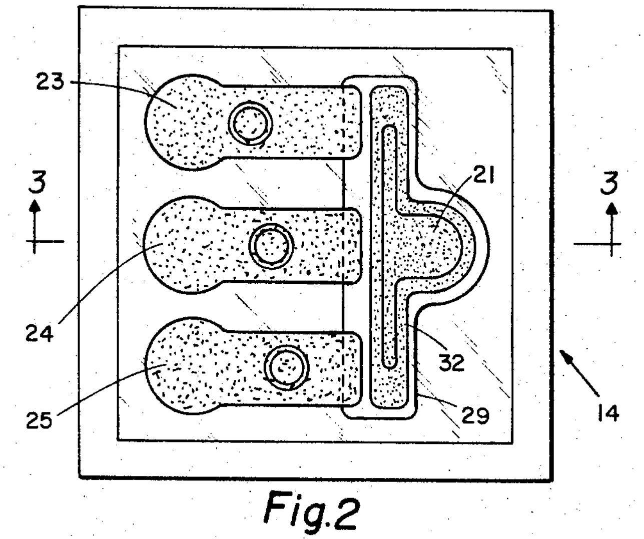
FIG. 2 is an enlarged plan view of a unijunction transistor die which is the active element mounted on the header shown in FIG. 1.

The invention is embodied in a novel unijunction transistor having preselected electrical characteristics. The unijunction transistor includes a semiconductor die having two substantially flat and parallel major faces, at least one of which has a passivating layer disposed over a major portion thereof. An emitter region of a conductivity type different from the die extends from the passivated face into the die and forms a PN junction therewith that terminates under the passivating layer on that face. An emitter contact, disposed on the passivating layer, connects through an opening therein to the above mentioned emitter region. Means is provided for electrically coupling the emitter to a circuit. A plurality of base one regions of the same conductivity type as the die extend therein from the passivated face. Each of the base one regions has a predetermined diameter and is spaced a preselected distance from the emitter PN junction. A plurality of base one contacts corresponding to the base one regions are disposed on the passivating layer and connected through openings therein to the base one regions. Means is provided for electrically coupling one of the base one contacts constituting the unijunction transistor with the preselected electrical characteristics to an external circuit. A base two region, also of the same conductivity type as the die, covers substantially the entire face opposite that including the emitter and the base one contacts. A contact is disposed on the base two region and means provided for connecting it to an external circuit.

The semiconductor material utilized for the die of the unijunction transistor according to the invention is advantageously a single crystal element such as silicon or germanium, although various semiconductor compounds may also be employed. The die is advantageously originally a portion of a wafer which is typically obtained from a larger crystal grown by known crystal pulling or melting processes. The larger crystal is sliced into wafers and the wafers lapped, polished and otherwise processed to make their major faces substantially parallel to each other.

The emitter region comprises a region of conductivity type opposite that of the die and is generally formed using well known solid state diffusion techniques. This region may be located on one edge or in a central position of the die consistent with the overall device layout.

The base one regions of the die usually comprise a plurality of highly doped regions of the same conductivity type as the die. With the multiple base one regions of the invention, fine adjustments are readily made to vary preselected electrical characteristics such as intrinsic stand off ratio, valley current, and emitter saturation voltage. It is possible to position the individual base one regions on a single die at varying distances from the emitter PN junction so that each region yields a different set of preselected electrical characteristics. This die may then be used to fabricate a variety of transistors with different preselected electrical characteristics. In devices requiring very close control, the base one regions are positioned at substantially equal distances from the emitter PN junction to increase the probability of one of the regions fulfilling the required electrical characteristics. Also, if one of the base one regions should be defective, a selection may usually be made from the remaining base one regions to complete the unijunction transistor.

This flexibility in fabricating the base one regions primarily results from the placement of the base two region on a face of the die opposite the face including the base one and the emitter. Generally, this base two region covers substantially the entire opposite face.

The characteristics of the device are readily alterable because of the ease of changing the dimensions of the base one regions and their spacing from the emitter PN junction and each other. To change the diameter of a base one region, usually only one mask in a mask set needs to be altered. This means that there is only a slight change in the equipment utilized therefore. For more complicated alterations involving both the position of the base one region and the diameter thereof, normally only two masks need to be changed with very little change in the device processing. For greater changes, the emitter configuration and the base one configuration are obviously alterable over a broad range. Any one of these changes causes a corresponding change in the electrical charactertistics of the transistor.

With this structure, it is also possible to prefabricate a number of wafers up to the point of the formation of the base one regions and thereby reduce the time required for fabricating a transistor meeting preselected electrical characteristics.

This transistor die is advantageously encapsulated in the well known hermetically sealed metal can type package. The die is also suitable for encapsulation in a plastic package.

Figure 1:
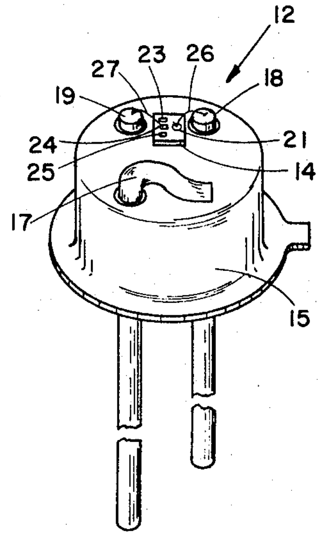
FIG. 1 is an enlarged, perspective view of an assembled header of a unijunction transistor in accordance with one embodiment of this invention.

An assembled header 12 for a unijunction transistor embodying the structure of the invention is illustrated in FIG. 1. Header 12 includes a die 14 fixedly mounted by well known techniques on a metal shell 15. Three wire leads 17, 18 and 19 for connecting the unijunction transistor to a circuit are hermetically sealed in shell 15 by a glass-to-metal seal.

One face of die 14, including the base two contact (not shown), is attached to shell 15. A fine wire 26 connects an emitter contact 21 to lead 18. Another fine wire 27 connects a base one contact 24, selected from three base one contacts 23, 24, 25 to lead 19. Die 14 and adjacent fine wires 26, 27 when assembled on header 12 are usually encapsulated in a hermetically sealed container (not shown).

Figure 3:
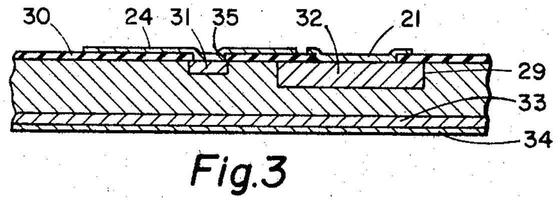
FIG. 3 is a cross-sectional view along line 3—3 of FIG. 2.

The structure of die 14 will be more clearly understood by referring to the enlarged illustrations in FIGS. 2 and 3. Die 14 is shown as a separate die, although it was originally one of a plurality of dice fabricated simultaneously on a wafer of semiconductor material. Preferably, die 14 is a thin piece of silicon with faces which are smooth and parallel as the result of careful preparation thereof during the initial processing of the wafer. The top face of the die is covered with a passivating layer 30 of silicon dioxide that also serves as a diffusion mask.

Emitter contact 21 makes contact to a diffused emitter region 32 through an opening in passivating layer 30. Emitter region 32 is a highly doped region of a conductivity type opposite that of the die that extends from the top face of die 14 into its bulk region and forms a PN junction 29 therewith that terminates under passivating layer 30. Emitter region 32 is positioned, in this embodiment, toward one edge of die 14.

Spaced from emitter 21 on the top face of die 14 are three base one contacts 23, 24 and 25. Contacts 23, 25 are connected to their respective base one regions through openings in passivating layer 30 similar to the manner that contact 24 is connected to base one region 31 through opening 35. These base one regions are very highly doped and of the same conductivity type as die 14, thereby providing good ohmic contact between the die and the metal contact thereon. The diameter of the base one regions and their spacing from PN junction 29 are largely determinative of the electrical characteristics of the final transistor.

On the opposite face of die 14, a base two contact 34 is formed on another highly doped region 33 of the same conductivity type as the die. This base two contact covers substantially the entire bottom face of die 14.

Figure 4:
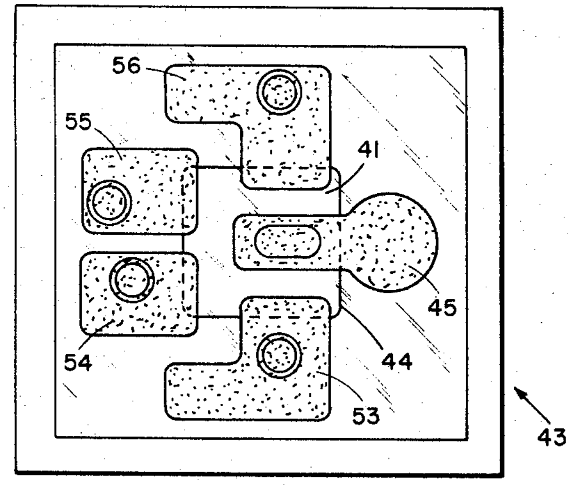
FIG. 4 is an enlarged plan view of a unijunction transistor die according to another embodiment of the invention.

In another embodiment of this invention (FIG. 4), a die 43, similar to die 14, is illustrated that includes a centrally located emitter region 41 forming a PN junction 44 with the bulk of the die. This junction terminates under a passivating layer (not visible) covering the top face of die 43. An emitter contact 45 deposited on the passivating layer contacts emitter 41 through an opening therein. Surrounding PN junction 44 are a plurality of base one regions spaced at varying distances therefrom. Base one contacts 53, 54, 55, 56, deposited on the passivating layer connect to these base one regions through openings therein. A base two contact on the opposite face of the die (not visible in this view) is formed as previously described. With this structure, a greater number of base one contacts may be fabricated, if so required, for the device. Other configurations of emitter and base ones are possible and may be preferred as demanded by the device requirements.

In a typical processing sequence for the fabrication of a unijunction transistor having a structure according to the invention, a wafer of semiconductor material, preferably N-type silicon about 1 inch in diameter and 8 mils thick with a resistivity between 50 and 70 ohm-centimeters, had a passivating layer of silicon dioxide 10,000 angstroms thick thermally grown on the faces thereof. A film of one of the well known photosensitive etch resistance materials was deposited on one face of the wafer and exposed to light while covered with a photographic plate including a plurality of emitter patterns. The photosensitive material was developed and the oxide removed by etching from the preselected emitter regions according to well known etching techniques. Upon completion of the etching, the remainder of the photosensitive material was removed. The areas exposed in this manner were subjected to a diffusion utilizing boron as a dopant to form P-type emitter regions about 2.5 microns deep. Additional silicon dioxide was grown on the exposed areas of the face during the drive-in portion of the cycle to passivate and protect the emitter regions.

Another pattern was formed on the face of the wafer including the emitters exposing areas of silicon to be doped N+ for the base one regions and scribe lines for separating the dice prior to encapsulation. After the patterning sequence was completed, the opposite face of the wafer was polished to remove all boron doped material and expose the original N-type silicon in preparation for the formation of the base two contacts. The wafer was subjected to a diffusion using phosphorus as a dopant to form base one and base two N+ regions. These regions were diffused to a depth of about 3 microns.

Again the patterning sequence was performed to remove portions of the passivating layer covering the previously formed base one regions and emitter regions in preparation for the formation of the contact thereto. The wafers were placed in a vacuum chamber and aluminum about 7,000 angstroms thick deposited thereon by well known metal evaporation techniques. This aluminum was patterned in another sequence to form the base one and emitter contacts for the transistors. The base two contacts were formed by placing the wafer in another vacuum chamber and evaporating gold about 2,000 angstroms thick on the base two face. The completed wafer was scribed and broken to form individual dice.

The base one contacts of the individual die were electrically probed prior to encapsulation to determine which of them possessed the preselected electrical characteristics. with the base one contact marked that met these values, the die was affixed to the header portion for the finally assembled transistor. Connections were made with fine wires about 1 mil in diameter between the appropriate contacts and wire leads for connecting the ultimate transistor into an external circuit. A cap was then hermetically sealed to the header to protect the die and its adjacent connections. With the formation of this seal, the unijunction transistor was complete and ready for the final testing prior to use.

The above description and drawings show that the present invention provides a unijunction transistor with a novel unijunction transistor die capable of meeting preselected electrical characteristics. Furthermore, the unijunction transistor of the invention is more easily fabricated and a higher percentage of the devices meet preselected electrical characteristics. Moreover, this unijunction transistor has higher interbase modulated current and better temperature compensation.

We claim:

1. A semiconductor device having preselected electrical characteristics including in combination, a semiconductor die with first and second opposed major faces, an emitter region extending into said die from said first major face of a conductivity type opposite said die, means forming a base two, a plurality of base one regions each capable of completing a semiconductor device having different electrical characteristics extending into said die from said first face at predetermined distances from said emitter region, said plurality of regions having the same conductivity type as said die and a lower resistivity, and contact means connected to at least one of said plurality of regions completing a semiconductor device having preselected electrical characteristics.

2. A semiconductor device according to claim 1 in which said semiconductor die comprises silicon.

3. In a unijunction transistor having preselected electrical characteristics, a semiconductor die with two substantially flat and parallel major faces, at least one of said major faces having a passivating layer disposed over a major portion thereof; an emitter region extending from said one face into said die of a conductivity type different than said die and forming a PN junction therewith terminating under said passivating layer at said one face; an emitter contact on said passivating layer connected through an opening therein to said emitter region; means for electrically coupling said emitter contact to a circuit; a plurality of spaced base one regions of the same conductivity type as said die extending therein from said one face, each of said base one regions being of a predetermined diameter and located at preselected distances from said emitter PN junction; a plurality of base one contacts corresponding to said base one regions on said passivating layer connected respectively through openings therein to said base one regions; means for electrically coupling at least one of said base one contacts constituting a unijunction transistor with preselected electrical characteristics to an external circuit; a base two region of the same conductivity type as said die covering substantially the entire face opposite said one face; a base two contact on said base two region; and means for electrically coupling said base two contact to an external circuit.

4. A unijunction transistor according to claim 1 in which said base one regions have a higher impurity concentration than said die.

5. A unijunction transistor according to claim 1 in which said semiconductor die comprises silicon.

6. A unijunction transistor according to claim 1 in which said passivating layer comprises silicon dioxide.

7. A unijunction transistor according to claim 1 in which said emitter, base one and base two contacts comprise an electrically conducting metal in ohmic connection with said semiconductor die.

8. A unijunction transistor according to claim 1 in which said semiconductor die and adjacent components are enclosed in a hermetically sealed encapsulation.

References Cited

UNITED STATES PATENTS

| | | | |
|---|---|---|---|
| 2,769,926 | 11/1956 | Lesk | 307—301 |
| 3,039,028 | 6/1962 | Ross | 317—234 |
| 3,163,916 | 1/1965 | Gault | 29—25.3 |
| 3,253,196 | 5/1966 | Sylvan | 307—301 X |
| 3,325,705 | 6/1967 | Clark | 317—235 |

FOREIGN PATENTS 854,753 11/1960 Great Britain.

OTHER REFERENCES

Clark, L., "Now New Unijunction Geometries," Electronics, June 14, 1965, pp. 93–97.

JOHN W. HUCKERT, *Primary Examiner.*

J. R. SHEWMAKER, *Assistant Examiner.*

U.S. Cl. X.R.

307—301